United States Patent
Li et al.

(10) Patent No.: US 8,306,099 B2
(45) Date of Patent: Nov. 6, 2012

(54) SIGNAL RECEIVING DEVICE AND FREQUENCY DETERMINING CIRCUIT

(75) Inventors: Cho-Hsin Li, Pingtung County (TW); Tsung-Li Yeh, Penghu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 632 days.

(21) Appl. No.: 12/564,987

(22) Filed: Sep. 23, 2009

(65) Prior Publication Data

US 2010/0080273 A1    Apr. 1, 2010

(30) Foreign Application Priority Data

Sep. 26, 2008 (TW) .............................. 97137198 A

(51) Int. Cl.
*H04B 3/46* (2006.01)
(52) U.S. Cl. ...................................................... 375/224
(58) Field of Classification Search .................. 375/224, 375/228, 316, 319; 714/760, 752
See application file for complete search history.

(56) References Cited

U.S. PATENT DOCUMENTS 7,634,706 B1 * 12/2009 Chen et al. .................... 714/760
2009/0147885 A1 * 6/2009 Dimitriu ....................... 375/319

* cited by examiner

*Primary Examiner* — Khai Tran
(74) *Attorney, Agent, or Firm* — Faegre Baker Daniels LLP

(57) ABSTRACT

A signal receiving device is adapted for receiving a multi-bit signal-under-test that supports one of first and second base frequency types, and outputting a type indicator for indicating which one of the first and second base frequency types is supported by the signal-under-test. The signal receiving device includes a counter and a frequency determining circuit. The counter includes an accumulating unit for counting cycles of an operating clock so as to obtain a bit count. The frequency determining circuit is coupled to the counter for comparing the bit count to one of first and second preset values in accordance with a previous value of the type indicator so as to obtain a comparison result, and determining whether to update a value of the type indicator based on the comparison result.

18 Claims, 4 Drawing Sheets

SIGNAL RECEIVING DEVICE AND FREQUENCY DETERMINING CIRCUIT

CROSS-REFERENCE TO RELATED APPLICATION

This application claims priority of Taiwanese application no. 097137198, filed on Sep. 26, 2008.

BACKGROUND OF THE INVENTION

1. Field of the Invention

This invention relates to a frequency determining technique, more particularly to a signal receiving device and a frequency determining circuit that are adapted for receiving an SPDIF (Sony/Philips Digital Interconnect Format) signal and determining a frequency thereof.

2. Description of the Related Art

An SPDIF signal is a digital transmission signal supporting two base frequency types : a 48K base frequency, such as 48 KHz, 96 KHz, and 192 KHz; and a 44.1K base frequency, such as 44.1 KHz, 88.2 KHz, and 176.4 KHz. Since the two base frequency types are close to each other, frequency determination during a receiving process is critical.

A conventional method for frequency determination adopts a two-part technique in which a counter is first used to count bits that are received within a predetermined time period, wherein a frame defined by the SPDIF signal includes two sub-frames, and each of the sub-frames has thirty-two bits. A bit count is then compared to a reference value associated with a 46K base frequency. If the bit count is greater than the reference value, then a type indicator indicating the 48K base frequency is outputted for use in subsequent audio signal processing. Otherwise, the type indicator indicating the 44.1K base frequency is outputted.

However, on account of interference on a signal transmission channel, such as that resulting from electromagnetic effects, and/or a state in which clock frequencies used by a transmitting end and a receiving end are inconsistent, signals received by the receiving end often fluctuate around the 46K base frequency. Accordingly, when a base frequency that is determined by the conventional method changes, the type indicator that is outputted enters an unlocked state with respect to the base frequency, and re-enters a locked state with respect to another base frequency. Undesirably, data received during a process of changing frequency locking state is neglected. Moreover, if fluctuation persists, the type indicator can remain in the unlocked state for a prolonged period and fail to attain the lock state.

SUMMARY OF THE INVENTION

Therefore, the object of the present invention is to provide a signal receiving device and a frequency determining circuit capable of better sustaining a frequency locked state so as to prevent data loss.

According to one aspect of the present invention, there is provided a signal receiving device adapted for receiving a multi-bit signal-under-test that supports one of a first and a second base frequency types, and outputting a type indicator for indicating which one of the first and second base frequency types is supported by the signal-under-test. The signal receiving device comprises a counter and a frequency determining circuit. The counter includes an accumulating unit for counting cycles of an operating clock so as to obtain a bit count. The frequency determining circuit is coupled to the counter for comparing the bit count to one of a first and a second preset values in accordance with a previous value of the type indicator so as to obtain a comparison result, and determining whether to update a value of the type indicator based on the comparison result.

According to another aspect of the present invention, there is provided a frequency determining circuit adapted for receiving an operating clock and analyzing a multi-bit signal-under-test that supports one of first and second base frequency types, and for receiving a bit count indicating a count of cycles of the operating clock occurring within a predetermined time period. The frequency determining circuit comprises a register, a first comparator, a second comparator, and a multiplexer. The register is driven by the operating clock and outputs a type indicator having a value indicating which one of the first and second base frequency types is supported by the signal-under-test. The first comparator is for comparing the bit count to a first preset value. The second comparator is for comparing the bit count to a second preset value. The multiplexer is coupled to the first and second comparators for selecting a comparison result from one of the first and second comparators in accordance with a previous value of the type indicator for output to the register. The register updates the value of the type indicator accordingly.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
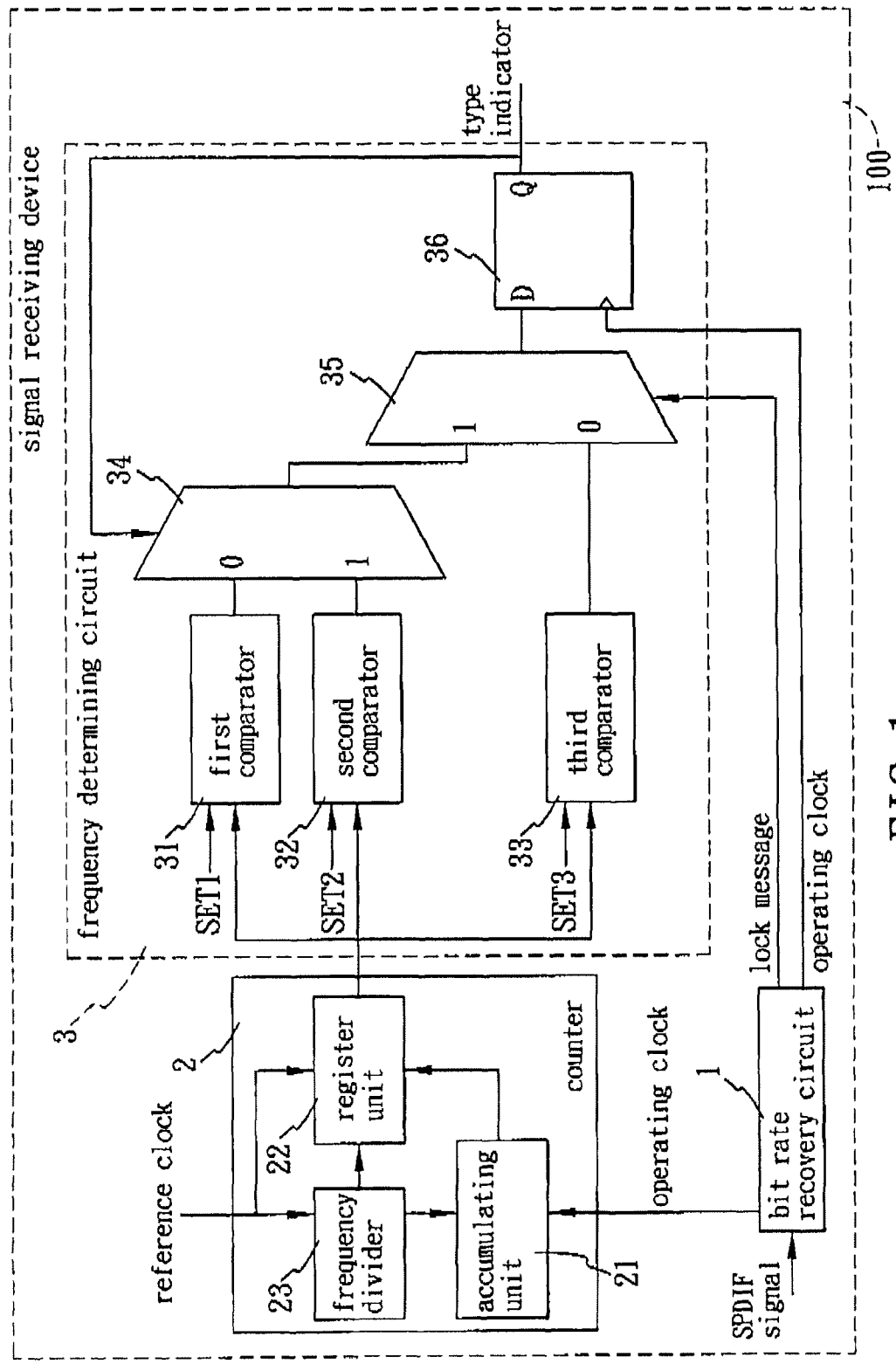
FIG. 1 is a schematic circuit block diagram of a preferred embodiment of a signal receiving device according to the present invention.

FIG. 1 illustrates the preferred embodiment of a signal receiving device 100 according to the present invention. The signal receiving device 100 is adapted for receiving a multi-bit signal-under-test that supports one of first and second base frequency types, and outputting a type indicator indicating which one of the first and second base frequency types is supported by the signal-under-test. The type indicator is used for processing audio signals. In this embodiment, the signal-under-test is an SPDIF (Sony/Philips Digital Interconnect Format) signal. Accordingly, the first base frequency type supported by the signal-under-test is a 48K base frequency, and the second base frequency type supported by the signal-under-test is a 44.1K base frequency. When the type indicator has a value '1', it indicates that the signal-under-test supports the first base frequency type, and when the type indicator has a value '0', it indicates that the signal-under-test supports the second base frequency type.

The signal receiving device 100 of the preferred embodiment comprises a bit-rate recovery circuit 1, a counter 2, and a frequency determining circuit 3. The bit-rate recovery circuit 1 is coupled to the counter 2 and to the frequency determining circuit 3. The counter 2 is adapted to receive a reference clock, and includes an accumulating unit 21 and a register unit 22. The frequency determining circuit 3 is coupled to the counter 2, and includes a first comparator 31, a second comparator 32, a third comparator 33, a first multiplexer 34, a second multiplexer 35, and a register 36.

The signal receiving device 100 is capable of distinguishing a signal format of the first base frequency type from that of the second base frequency type. For instance, the signal receiving device 100 is capable of distinguishing between 48 KHz and 44.1 KHz, between 96 KHz and 88.2 KHz, and between 192 KHz and 176.4 KHz. Below, the method for distinguishing between 48 KHz and 44.1 KHz is first presented.

The bit-rate recovery circuit 1 extracts a recovery clock from the signal-under-test and outputs the recovery clock to the accumulating unit 21 of the counter 2 and the register 36 of the frequency determining circuit 3 for use as an operating clock. The bit-rate recovery circuit 1 is further capable of outputting a lock message indicating a frequency locking state of the operating clock. When the lock message has a value of '1', it indicates a locked state of the operating clock, wherein a frequency of the operating clock equals a bit rate of the signal-under-test.

Figure 2:
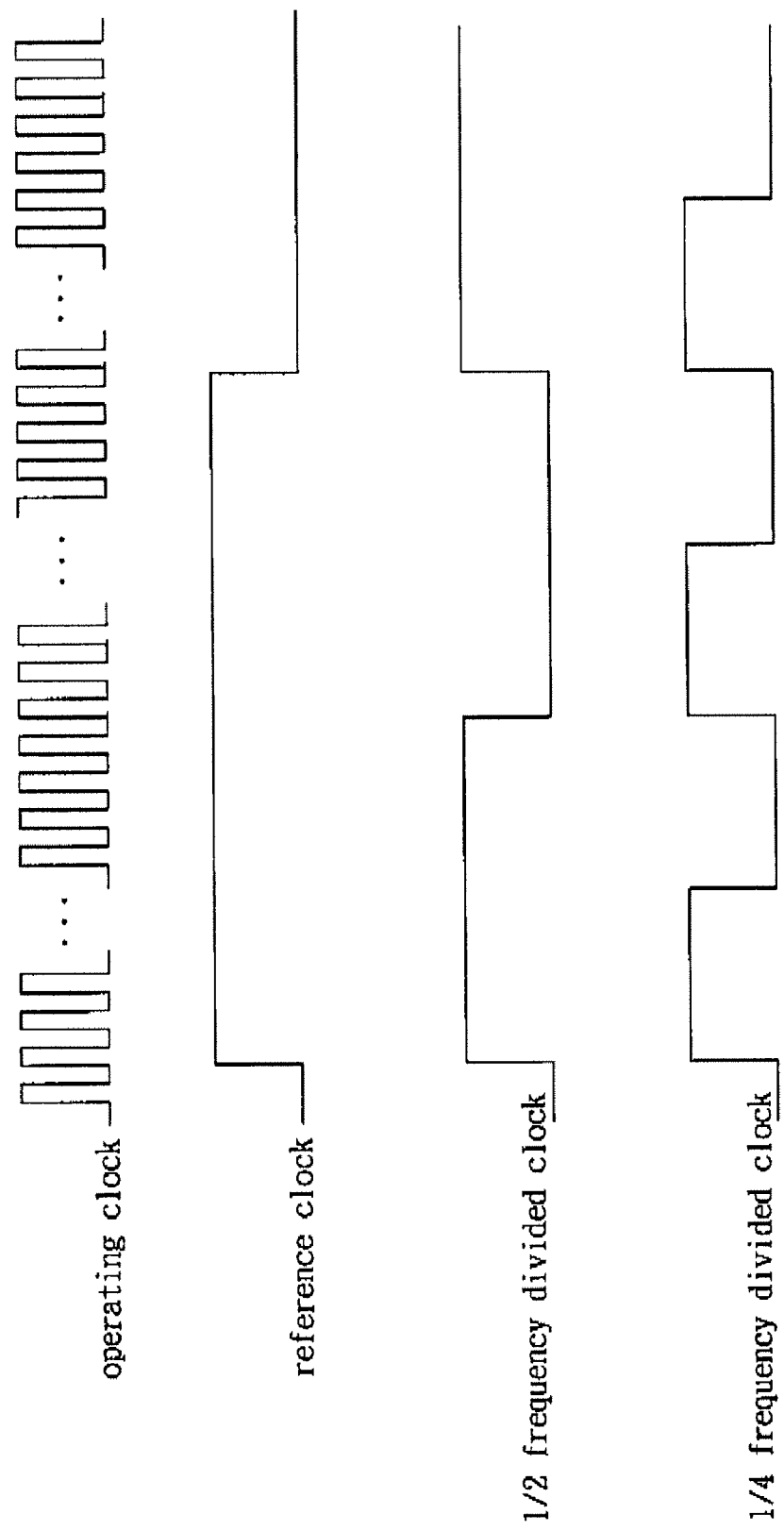
FIG. 2 is a timing diagram to illustrate a reference clock and frequency-divided clocks associated with an operating clock.

The accumulating unit 21 of the counter 2 counts cycles of the operating clock (a cycle being a reciprocal of a frequency) during a high potential period of the reference clock so as to obtain a cycle count signal, wherein the frequency of the reference clock is lower than that of the operating clock, as shown in FIG. 2. The register unit 22 is coupled to the accumulating unit 21 for storing the cycle count signal, and outputting the cycle count signal at a rising edge of every one of the high potential periods of the reference clock so as to obtain the bit count.

The first comparator 31, the second comparator 32 and the third comparator 33 of the frequency determining circuit 3 are used to compare the bit count with a first preset value (SET1), a second preset value (SET2) and a third preset value (SET3), respectively. In this embodiment, the first preset value (SET1) is a count of cycles of a 47 KHz clock during the high potential period of the reference clock, the second preset value (SET2) is a count of cycles of a 45 KHz clock during the high potential period of the reference clock, and the third preset value (SET3) is a count of cycles of a 46 KHz clock during the high potential period of the reference clock.

The first multiplexer 34 of the frequency determining circuit 3 is coupled to the first and second comparators 31, 32 for selecting a comparison result from one of the first and second comparators 31, 32 in accordance with a previous value of the type indicator for subsequent output. The second multiplexer 35 of the frequency determining circuit 3 is coupled to the bit-rate recovery circuit 1, the first multiplexer 34, and the third comparator 33 for selecting one of the output from the first multiplexer 34 and the comparison result from the third comparator 33 for subsequent output in accordance with the lock message. The register 36 is coupled to the second multiplexer 35 for receiving the output from the second multiplexer 35, and outputting the type indicator in accordance with the output received from the second multiplexer 35.

Figure 3:
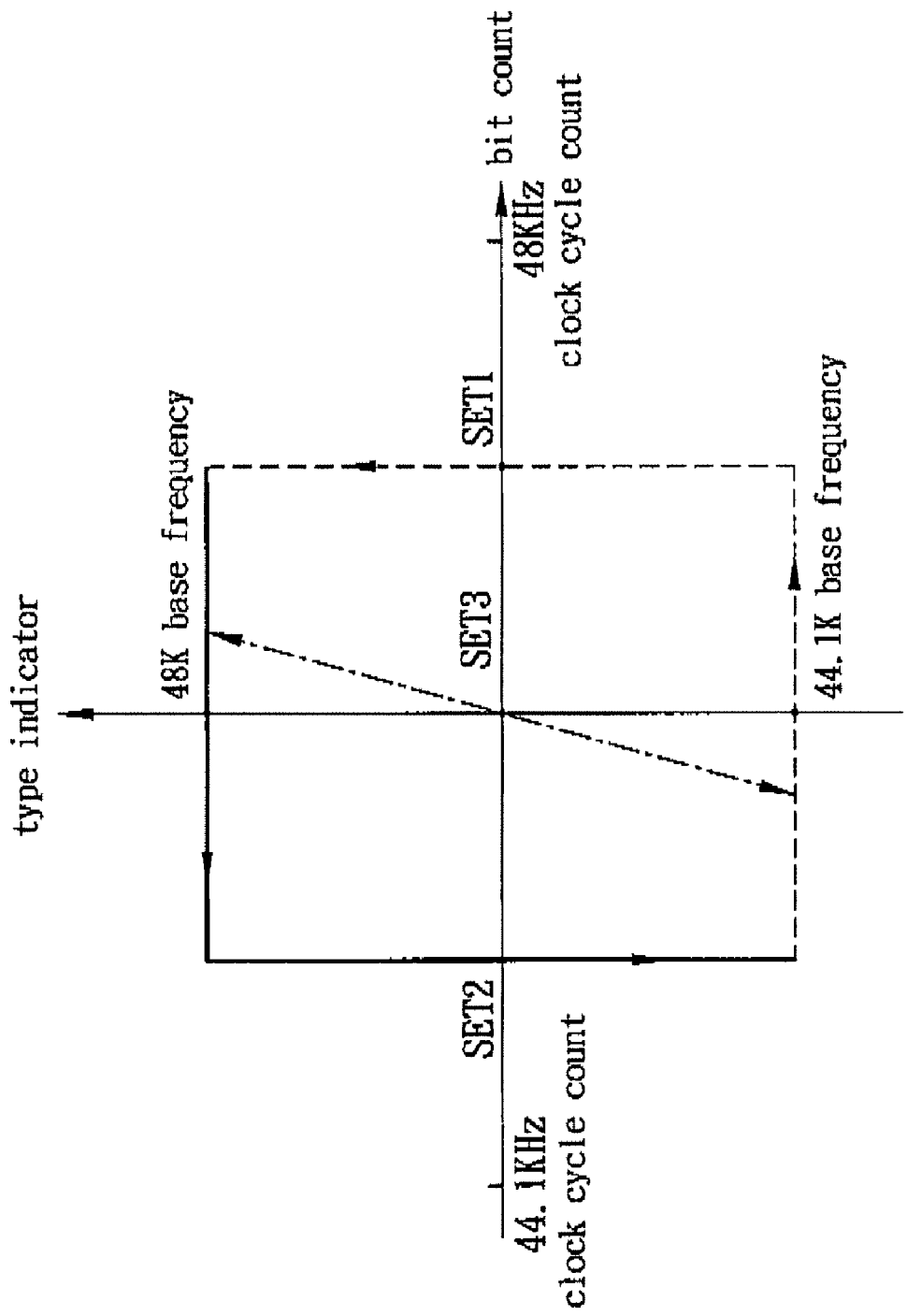
FIG. 3 is a diagram to illustrate operating principles of a frequency determining circuit of the preferred embodiment.

With further reference to FIG. 3, when the bit-rate recovery circuit 1 detects that the frequency of the operating clock is in an unlocked state, the bit-rate recovery circuit 1 outputs the lock message having a value of '0'. The second multiplexer 35, in accordance with the lock message, then selects the comparison result from the third comparator 33 for subsequent output. Consequently, when the third comparator 33 determines that the bit count is greater than the third preset value (SET3), the type indicator that is outputted has a value of '1', indicating that the signal-under-test supports the first base frequency type (48K), and when the third comparator 33 determines that the bit count is not greater than the third preset value (SET3), the type indicator that is outputted has a value of '0', indicating that the signal-under-test supports the second type of base frequency (44.1K), as shown by the broken line segments in FIG. 3.

When the bit-rate recovery circuit 1 detects that the frequency of the operating clock is in the locked state, the bit-rate recovery circuit 1 outputs the lock message having the value of '1'. The second multiplexer 35, in accordance with the lock message, then selects the output from the first multiplexer 34 for subsequent output. Consequently, when the previous value of the type indicator is '1', the first multiplexer 34 accordingly selects the comparison result from the second comparator 32 for output. When the second comparator 32 determines that the bit count is less than the second preset value (SET2), the first multiplexer 34 causes the register 36 to output the type indicator having the value of '0', indicating that the signal-under-test supports the second base frequency type (44.1K), as shown by the solid lines in FIG. 3. Otherwise, the previous value of '1' of the type indicator is maintained. Conversely, when the previous value of the type indicator is '0', the first multiplexer 34 accordingly selects the comparison result from the first comparator 31 for output. When the first comparator 31 determines that the bit count is greater than the first preset value (SET1), the first multiplexer 34 causes the register 36 to output the type indicator having the value of '1', indicating that the signal-under-test supports the first base frequency type (48K), as shown by the broken lines in FIG. 3. Otherwise, the previous value of '0' of the type indicator is maintained.

Through comparing the bit count to the preset values (SET1), (SET2), (SET3), the frequency determining circuit 3 is able to raise thresholds for changing the value of the type indicator. A period of time during which the locked state can be maintained is thus lengthened in comparison to that associated with the prior art, thereby reducing the likelihood of occurrences of an unlocked state that is undesirably long, and failure to attain the locked state. Consequently, the present invention also reduces data loss associated with changing the frequency locking state.

Referring to FIG. 2, in the foregoing distinguishing between 48 KHz and 44.1 KHz, the counter 2 uses the rising edge of every one of the high potential periods of the reference clock for obtaining the bit count. To adapt a frequency of the reference clock for use by the counter 2 in distinguishing between 96 KHz and 88.2 KHz, and between 192 KHz and 176.4 KHz, a frequency divider 23 (see FIG. 1) is coupled to the accumulating unit 21 and the register unit 22 for performing frequency division of the reference clock so as to obtain a frequency-divided clock. The frequency divider 23 divides the frequency of the reference clock by two for distinguishing between 96 KHz and 88.2 KHz, and by four for distinguishing between 192 KHz and 176.4 KHz. The frequency-divided clock is then provided to the accumulating unit 21 and the register unit 22. The accumulating unit 21 counts the cycles of the operating clock during a high potential period of the frequency-divided clock in order to obtain the cycle count signal. The register unit 22 stores the cycle count signal and outputs the cycle count signal at a rising edge of every one of the high potential periods of the frequency-divided clock so as to obtain the bit count. In this manner, the first preset value (SET1), the second preset value (SET2) and the third preset value (SET3) selected for use by the frequency determining circuit 3 need not be changed in accordance with multiples of the base frequencies.

It should be noted that embodiments of the counter 2 and the frequency determining circuit 3 are not limited to what has been disclosed herein. For example, distinguishing between of 96 KHz and 88.2 KHz, and between 192 KHz and 176.4 KHz can be made using a same reference clock by increasing the first preset value (SET1), the second preset value (SET2), and the third preset value (SET3) according to multiples of the base frequencies.

Figure 4:
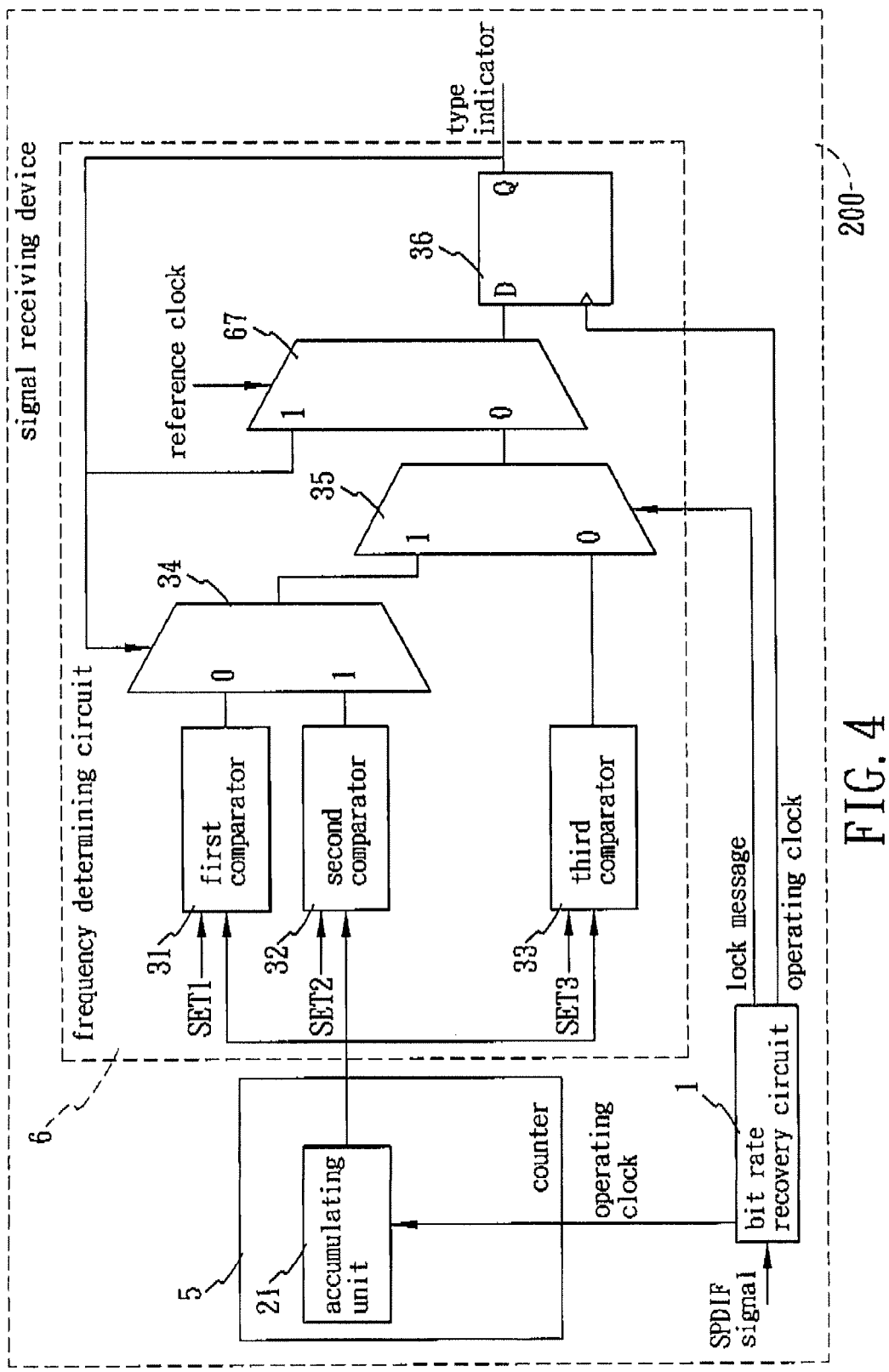
FIG. 4 is a schematic circuit block diagram of another preferred embodiment of a signal receiving device according to the present invention.

Moreover, in another preferred embodiment of a signal receiving device 200, as shown in FIG. 4, the register unit 22 and the frequency divider 23 of the counter 5 can be dispensed with, and a third multiplexer 67 that is adapted to receive the reference clock can be provided between the second multiplexer 35 and the register 36 of the frequency determining circuit 6. During the high potential period of the reference clock, the register 36 accepts control from the third multiplexer 67 for maintaining the value of the type indicator. During a low potential period of the reference clock, the register 36 accepts control from the third multiplexer 67 for updating the value of the type indicator in accordance with the output from the second multiplexer 35.

In addition, it is worth noting that the frequency determining circuit 3, 6 of the above-described embodiments can be implemented independently of the signal receiving device 100, 200.

In sum, through changing the preset values (SET1), (SET2), (SET3) of the signal receiving device 100, 200, conditions under which the frequency determining circuit 3, 6 changes the value of the type indicator are adjusted such that a tolerance range for frequency fluctuation of the signal-under-test can be significantly increased over that of the prior art. Since the locked state is better sustained and data loss is reduced, the goal of the present invention is accordingly achieved.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A signal receiving device adapted for receiving a multi-bit signal-under-test that supports one of a first and a second base frequency types, and outputting a type indicator for indicating which one of the first and second base frequency types is supported by the signal-under-test, the signal receiving device comprising:
a counter including an accumulating unit for counting cycles of an operating clock so as to obtain a bit count; and
a frequency determining circuit coupled to the counter for comparing the bit count to one of a first and a second preset values in accordance with a previous value of the type indicator so as to obtain a comparison result, and determining whether to update a value of the type indicator based on the comparison result.

2. The signal receiving device as claimed in claim 1, the frequency of the first base frequency type is higher than that of the second base frequency type, wherein
the first preset value is greater than the second preset value,
when the previous value of the type indicator indicates that the signal-under-test supports the first base frequency type, the frequency determining circuit compares the bit count to the second preset value, and when the bit count is less than the second preset value, the frequency determining circuit updates the value of the type indicator, and when the bit count is not less than the second preset value, the frequency determining circuit maintains the value of the type indicator, and
when the previous value of the type indicator indicates that the signal-under-test supports the second base frequency type, the frequency determining circuit compares the bit count to the first preset value, and when the bit count is greater than the first preset value, the frequency determining circuit updates the value of the type indicator, and when the bit count is not greater than the first preset value, the frequency determining circuit maintains the value of the type indicator.

3. The signal receiving device as claimed in claim 1, wherein the frequency determining circuit includes:
a first comparator for comparing the bit count to the first preset value;
a second comparator for comparing the bit count to the second preset value;
a first multiplexer coupled to the first and second comparators for selecting the comparison result from one of the first and second comparators in accordance with the previous value of the type indicator for subsequent output; and
a register coupled to the first multiplexer for receiving the output therefrom.

4. The signal receiving device as claimed in claim 3, wherein:
when the previous value of the type indicator indicates the first base frequency type and the second comparator determines that the bit count is less than the second preset value, the first multiplexer causes the register to output a value of the type indicator indicating the second base frequency type; and
when the previous value of the type indicator indicates the second base frequency type and the first comparator determines that the bit count is greater than the first preset value, the first multiplexer causes the register to output a value of the type indicator indicating the first base frequency type.

5. The signal receiving device as claimed in claim 1, further comprising a bit-rate recovery circuit coupled to the counter and to the frequency determining circuit for extracting the operating clock from the signal-under-test, providing the operating clock to the accumulating unit of the counter and to the frequency determining circuit, and outputting a lock message indicating a frequency locking state of the operating clock.

6. The signal receiving device as claimed in claim 5, wherein the frequency determining circuit includes:
a first comparator for comparing the bit count to the first preset value;
a second comparator for comparing the bit count to the second preset value;
a third comparator for comparing the bit count to a third preset value;
a first multiplexer coupled to the first and second comparators for selecting the comparison result from one of the first and second comparators in accordance with the previous value of the type indicator for subsequent output;
a second multiplexer coupled to the bit-rate recovery circuit, the first multiplexer, and the third comparator for selecting one of an output from the first multiplexer and a comparison result from the third comparator for subsequent output in accordance with the lock message; and
a register coupled to the second multiplexer for receiving the output therefrom.

7. The signal receiving device as claimed in claim 6, wherein
when the lock message indicates an unlocked state, the second multiplexer selects the comparison result from the third comparator for subsequent output, so that
when the third comparator determines that the bit count is greater than the third preset value, a value of the type indicator indicates that the signal-under-test supports the first base frequency type, and
when the third comparator determines that the bit count is not greater than the third preset value, a value of the type indicator indicates that the signal-under-test supports the second base frequency type.

8. The signal receiving device as claimed in claim 6, wherein
when the lock message indicates a locked state, the second multiplexer selects the output from the first multiplexer for subsequent output, so that
when the previous value of the type indicator indicates the first base frequency type, the first multiplexer selects the comparison result from the second comparator for output, and when the second comparator determines that the bit count is less than the second preset value, the first multiplexer causes the register to output a value of the type indicator indicating that the signal-under-test supports the second base frequency type, and
when the previous value of the type indicator indicates the second base frequency type, the first multiplexer selects the comparison result from the first comparator for output, and when the first comparator determines that the bit count is greater than the first preset value, the first multiplexer causes the register to output a value of the type indicator indicating that the signal-under-test supports the first base frequency type.

9. The signal receiving device as claimed in claim 1, wherein the counter is adapted to receive a reference clock and further includes:
a frequency divider coupled to the accumulating unit for performing frequency division of the reference clock so as to obtain a frequency-divided clock, and providing the frequency-divided clock to the accumulating unit, the accumulating unit counting the cycles of the operating clock during a high potential period of the frequency-divided clock in order to obtain a cycle count signal; and
a register unit coupled to the accumulating unit and the frequency divider for storing the cycle count signal and outputting the cycle count signal at a rising edge of every high potential period of the frequency-divided clock so as to obtain said bit count.

10. The signal receiving device as claimed in claim 1, wherein the frequency determining circuit includes a multiplexer that is adapted to receive a reference clock, and
during a high potential period of the reference clock, the frequency determining circuit accepts control from the multiplexer so as to maintain the value of the type indicator, and
during a low potential period of the reference clock, the frequency determining circuit accepts control from the multiplexer so as to update the value of the type indicator in accordance with a relationship of the bit count to the first and second preset values.

11. The signal receiving device as claimed in claim 1, wherein the signal-under-test that is received by the signal receiving device is a SPDIF (Sony/Philips Digital Interconnect Format) signal.

12. A frequency determining circuit adapted for receiving an operating clock and analyzing a multi-bit signal-under-test that supports one of first and second base frequency types, and for receiving a bit count indicating a count of cycles of the operating clock occurring within a predetermined time period, the frequency determining circuit comprising:
a register driven by the operating clock and outputting a type indicator having a value indicating which one of the first and second base frequency types is supported by the signal-under-test;
a first comparator for comparing the bit count to a first preset value;
a second comparator for comparing the bit count to a second preset value; and
a first multiplexer coupled to the first and second comparators for selecting a comparison result from one of the first and second comparators in accordance with a previous value of the type indicator for output to the register, the register updating the value of the type indicator accordingly.

13. The frequency determining circuit as claimed in claim 12, wherein:
when the previous value of the type indicator indicates the first base frequency type, the first multiplexer selects the comparison result from the second comparator for output, and when the second comparator determines that the bit count is less than the second preset value, the first multiplexer causes the register to output a value of the type indicator indicating that the signal-under-test supports the second base frequency type; and
when the previous value of the type indicator indicates the second base frequency type, the first multiplexer selects the comparison result from the first comparator for output, and when the first comparator determines that the bit count is greater than the first preset value, the first multiplexer causes the register to output a value of the type indicator indicating that the signal-under-test supports the first base frequency type.

14. The frequency determining circuit as claimed in claim 12, further adapted for receiving a lock message indicating a frequency locking state of the operating clock, and further comprising:
a third comparator for comparing the bit count to a third preset value; and
a second multiplexer coupled to the register, the first multiplexer, and the third comparator, the second multiplexer accepting control from the lock message for selecting one of an output from the first multiplexer and a comparison result from the third comparator for subsequent output to the register.

15. The frequency determining circuit as claimed in claim 14, wherein
when the lock message indicates an unlocked state, the second multiplexer outputs the comparison result from the third comparator, so that
when the third comparator determines that the bit count is greater than the third preset value, a value of the type indicator indicates that the signal-under-test supports the first base frequency type, and
when the third comparator determines that the bit count is not greater than the third preset value, a value of the type indicator indicates that the signal-under-test supports the second base frequency type.

16. The frequency determining circuit as claimed in claim 14, wherein
when the lock message indicates a locked state, the second multiplexer selects the output from the first multiplexer, so that
when the previous value of the type indicator indicates the first base frequency type, the first multiplexer selects the comparison result of the second comparator for output, and when the second comparator determines that the bit count is less than the second preset value, the first multiplexer causes the register to output a value of the type indicator indicating that the signal-under-test supports the second base frequency type, and
when the previous value of the type indicator indicates the second base frequency type, the first multiplexer selects the comparison result of the first comparator for output, and when the first comparator determines that the bit count is greater than the first preset value, the first multiplexer causes the register to output a value of the type indicator indicating that the signal-under-test supports the first base frequency type.

17. The frequency determining circuit as claimed in claim 12, further comprising a third multiplexer that is adapted to receive a reference clock,
wherein, during a high potential period of the reference clock, the register accepts control from the third multiplexer for maintaining a value of the type indicator, and
during a low potential period of the reference clock, the register accepts control from the third multiplexer for updating the value of the type indicator in accordance with an output from the first multiplexer.

18. The frequency determining circuit as claimed in claim 12, wherein the signal-under-test that is analyzed by the frequency determining circuit is a SPDIF (Sony/Philips Digital Interconnect Format) signal.

* * * * *